United States Patent
McLellan et al.

(10) Patent No.: US 7,224,048 B1
(45) Date of Patent: May 29, 2007

(54) FLIP CHIP BALL GRID ARRAY PACKAGE

(75) Inventors: Neil McLellan, Danville, CA (US); Tak Sang Yeung, Tin Shui Wai (HK)

(73) Assignee: ASAT Ltd., Tsuen Wan, New Territories (HK)

( * ) Notice: Subject to any disclaimer, the term of this patent is extended or adjusted under 35 U.S.C. 154(b) by 0 days.

(21) Appl. No.: 10/678,419

(22) Filed: Oct. 3, 2003

Related U.S. Application Data

(63) Continuation-in-part of application No. 10/211,567, filed on Aug. 5, 2002, now Pat. No. 6,667,191.

(51) Int. Cl.
   *H01L 23/02*   (2006.01)
(52) U.S. Cl. ........................... 257/678; 438/106
(58) Field of Classification Search ............ 257/678, 257/778, 779, 780; 438/106, 107, 108, 118, 438/119; 165/80.3; 419/10, 36, 44, 47, 419/48, 54, 55
   See application file for complete search history.

(56) References Cited

U.S. PATENT DOCUMENTS

| | | | |
|---|---|---|---|
| 5,330,701 A * | 7/1994 | Shaw et al. ............... | 419/10 |
| 5,523,049 A * | 6/1996 | Terpstra et al. ............ | 419/36 |
| 5,656,370 A * | 8/1997 | Murakami et al. ......... | 428/332 |
| 5,726,079 A * | 3/1998 | Johnson .................... | 438/106 |
| 6,069,023 A * | 5/2000 | Bernier et al. ............. | 438/107 |
| 6,392,290 B1 | 5/2002 | Kasem et al. | |
| 6,429,530 B1 | 8/2002 | Chen | |
| 6,441,475 B2 | 8/2002 | Zandman et al. | |
| 6,489,557 B2 | 12/2002 | Eskildsen et al. | |
| 6,498,387 B1 | 12/2002 | Yang | |
| 6,518,089 B2 | 2/2003 | Coyle | |
| 6,570,259 B2 * | 5/2003 | Alcoe et al. ............... | 257/778 |
| 6,583,513 B1 * | 6/2003 | Utagikar et al. ........... | 257/778 |
| 6,800,948 B1 * | 10/2004 | Fan et al. .................. | 257/783 |
| 2003/0150595 A1 * | 8/2003 | Chen et al. | |

OTHER PUBLICATIONS

Chen et al., Structure and Manufacture of a Heat Sink with High Heat Transmission, Pub. date Aug. 14, 2003, p. 1, [0012].*

* cited by examiner

*Primary Examiner*—Phuc T. Dang
(74) *Attorney, Agent, or Firm*—Morrison & Foerster LLP

(57) ABSTRACT

A flip-chip ball grid array integrated circuit package with improved thermo-mechanical properties is provided. The package includes a substrate having first and second surfaces and a plurality of conductive traces therebetween. A semiconductor die is flip-chip mounted to the first surface of the substrate and electrically connected to ones of the conductive traces. An intermetallic heat spreader is fixed to a back side of the semiconductor die and a plurality of contact balls are disposed on the second surface of the substrate. The contact balls are in the form of a ball grid array and ones of the contact balls of the ball grid array are electrically connected to ones of the conductive traces.

17 Claims, 2 Drawing Sheets

FLIP CHIP BALL GRID ARRAY PACKAGE

FIELD OF THE INVENTION

This is a continuation-in-part of U.S. patent application Ser. No. 10/211,567 entitled Improved Chip Scale Integrated Circuit Package, filed Aug. 5, 2002, now U.S. Pat. No. 6,667,191.

FIELD OF THE INVENTION

The present invention relates in general to integrated circuit packaging, and more particularly to a flip chip ball grid array package with improved thermo-mechanical properties.

BACKGROUND OF THE INVENTION

High performance integrated circuit (IC) packages are well known in the art. Improvements in IC packages are driven by industry demands for increased thermal and electrical performance and decreased size and cost of manufacture In general, array packaging such as Ball Grid Array (BGA) packages provide a high density of interconnects relative to the surface area of the package. Typical BGA packages include a convoluted signal path, giving rise to high impedance and an inefficient thermal path which results in poor thermal dissipation performance. With increasing package density, the spreading of heat generated by the device is increasingly important.

Direct connection of the semiconductor die to a substrate surface in a flip-chip orientation, using solder ball connections provides low impedance packages relative to the use of wire-bond connections and provides reduced package space. This technology is becoming increasingly popular with package fabrication advances including advances in forming and placing of solder balls in flip-chip packaging.

FIG. 1 shows a sectional view of a conventional flip-chip BGA package indicated generally by the numeral 20. The flip-chip BGA package includes a substrate 22 with a semiconductor die 24 mounted in a flip-chip orientation, to a first surface of the substrate 22. Solder balls 26 provide electrical connections between the semiconductor die 24 and the substrate 22. Solder balls 28, in the form of a ball grid array are disposed on the second surface of the substrate. These packages suffer disadvantages, however.

One particular disadvantage is the generation of thermally induced stress in these packages, due to a mismatch in coefficients of thermal expansion (CTE) between the semi-conductor die and the motherboard, when the package is in use. During temperature cycling, the CTE mismatch creates stresses and strains which are concentrated in the solder ball interconnects between the die and the substrate and in the semiconductor die. In extreme cases, the semiconductor die warps and fatigue failure occurs in the solder ball interconnects.

Variations to the conventional flip-chip BGA have been proposed for the purpose of increased performance. In one exemplary variation, a metal heat spreader is fixed to the back of the semiconductor die to aid in the dissipation of heat. While heat is better dissipated in this package than in the conventional flip-chip BGA, described above, CTE mismatch between the semiconductor die and the motherboard, still cause stresses and strains that have deleterious effects on the package integrity.

Thus, further improvements in flip-chip ball grid array packages are desirable in order to meet industry demands for increased performance.

SUMMARY OF THE INVENTION

In one aspect of the present invention, a flip-chip ball grid array integrated circuit package with improved thermo-mechanical properties is provided. The package includes a substrate having first and second surfaces and a plurality of conductive traces therebetween. A semiconductor die is flip-chip mounted to the first surface of the substrate and electrically connected to ones of the conductive traces. An intermetallic heat spreader is fixed to a back side of the semiconductor die and a plurality of contact bails are disposed on the second surface of the substrate. The contact balls are in the form of a ball grid array and ones of the contact balls of the ball grid array are electrically connected with ones of the conductive traces.

In another aspect of the present invention, an integrated circuit package is provided. The integrated circuit package includes a substrate having first and second surfaces and a plurality of conductive traces therebetween. A semiconductor die is flip-chip mounted to the first surface of the substrate and electrically connected to ones of the conductive traces. A heat spreader having a coefficient of thermal expansion in the range of about 18 ppm/° C. to about 26 ppm/° C., is fixed to a back side of the semiconductor die, and a plurality of contact balls are disposed on the second surface of the substrate, in the form of a ball grid array. Ones of the contact balls of the ball grid array are electrically connected with ones of the conductive traces.

Advantageously, the use of an intermetallic compound, such as copper aluminide, fixed directly to a silicon wafer provides an effective heat spreader for dissipating heat away from the semiconductor die of the IC package. In one aspect, the intermetallic compound has a coefficient of thermal expansion that is close to that of a typical motherboard and an elastic modulus that is high to restrain the semiconductor die thereby reducing stress at the solder ball interconnects and inhibiting the die from warping.

BRIEF DESCRIPTION OF THE DRAWINGS

The present invention will be better understood with reference to the drawings and the following description, in which.

DETAILED DESCRIPTION OF THE PREFERRED EMBODIMENTS

Figure 1:
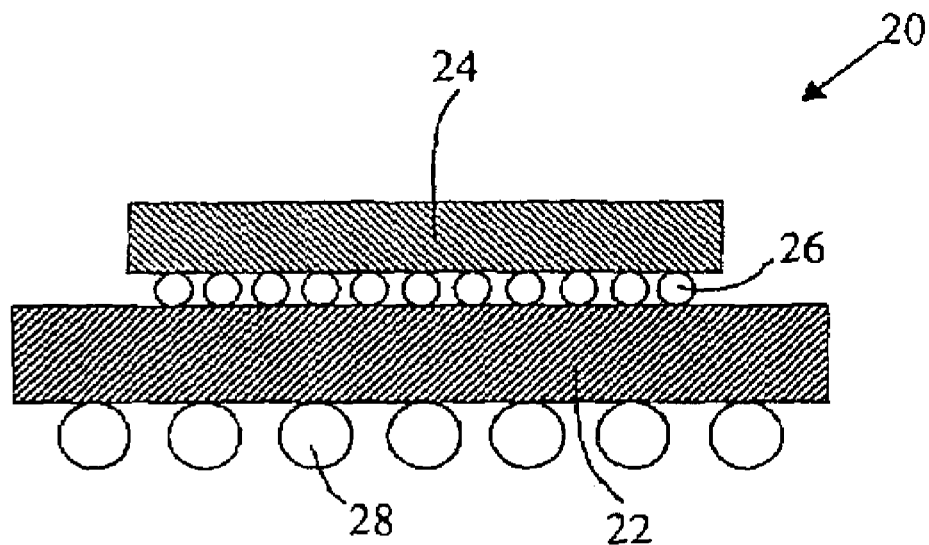
FIG. 1 is a sectional view of a conventional flip-chip ball grid array package.
Figure 2:
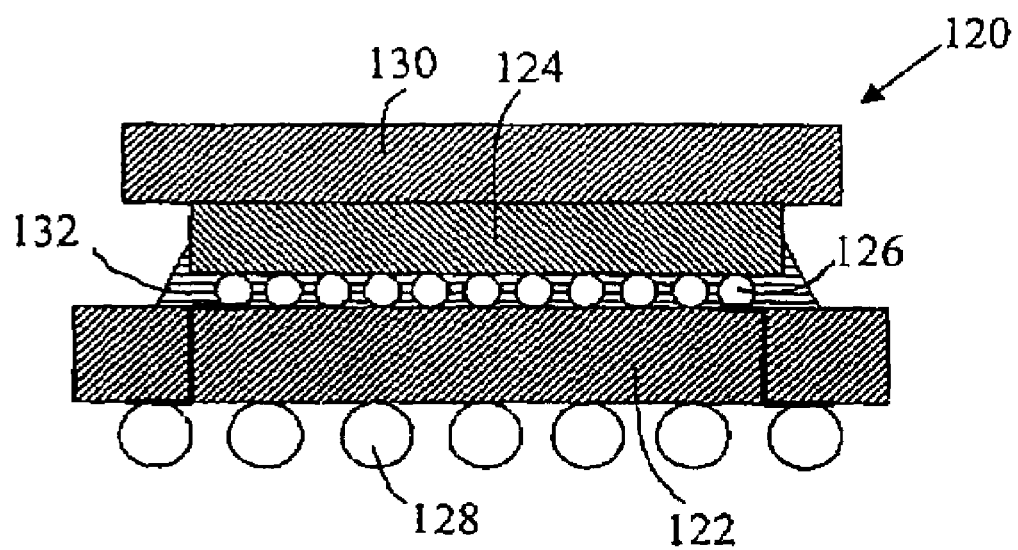
FIG. 2 is a sectional view of flip-chip ball grid array package according to a first embodiment of the present invention.

Reference is now made to FIG. 2 to describe a first embodiment of a flip chip ball grid array (BGA) package 20, indicated generally by the numeral 120. To simplify the description, the numerals used previously in describing FIG.

1, will be used again after raising the numerals by 100 where parts to be described correspond to parts already described.

The flip-chip BGA package 120 includes a substrate 122 having first and second surfaces and a plurality of conductive traces therebetween. A semiconductor die 124 is flip-chip mounted to the first surface of the substrate 122 and electrically connected to ones of the conductive traces. An intermetallic heat spreader 130 is fixed to a backside of the semiconductor die 124 and a plurality of contact balls 128 are disposed on the second surface of the substrate. The contact balls 128 are in the form of a ball grid array and ones of the contact balls 128 of the ball grid array are electrically connected with ones of the conductive traces of the substrate 122.

The flip-chip BGA package 120 will now be described in more detail with reference to the sectional view of the flip-chip BGA package 120 of FIG. 2. The flip-chip BGA package 120 includes the substrate 122 of a BT resin/glass epoxy printed circuit board with conductive traces for signal transfer. The conductive traces are typically copper and connect the interconnect pads on the first side of the substrate 122 and contact pads on the second side of the substrate 122. Interconnect pads and contact pads are connected by the copper conductive traces of the substrate 122 that extend therebetween. The interconnect pads connect with the solder ball electrical connectors 126 of the semiconductor die 124 and the contact pads connect with the contact balls 128 of the ball grid array. A solder mask is deposited on the upper and lower surface of the substrate 122, with the interconnect pads and the contact pads of the conductive traces exposed.

The semiconductor die 124 is flip-chip mounted to the upper surface of the substrate 122. The semiconductor die 124 is mounted to the substrate 122 by solder ball connection of pads of the semiconductor die 124 with the interconnect pads of the substrate 122. The solder balls 126 are placed on the substrate 122 using known pick and place and reflow techniques. Preferably the solder balls 126 are made of solder with a reflow temperature greater than the reflow temperature of eutectic solder. It will be appreciated that the pads of the semiconductor die 124 align with the interconnect pads of the substrate 122 and the solder balls 126 electrically connect the semiconductor die 124 with the interconnect pads.

The area under the semiconductor die 124 is filled with a thermosetting plastic compound, referred to generally as an underfill material 132. The underfill material 132 surrounds the solder balls 126 that connect the semiconductor die 124 and the interconnect pads of the substrate 122. The underfill material 132 serves to absorb some of the thermally induced stresses.

The intermetallic heat spreader 130 is in the form of a plate of intermetallic compound and is fixed to the backside of the semiconductor die 124 using a thermally conductive adhesive or thermally conductive epoxy.

Intermetallic compounds, also referred to as intermetallics are chemical compounds based on definite atomic formulas, each with a fixed or narrow range of chemical composition. The intermetallic compounds are stoichiometric combinations of metallic ions that form bonded matrices of compounds, the properties of which vary significantly. In the present embodiment, the intermetallic heat spreader 130 is made of an intermetallic compound that has a coefficient of thermal expansion (CTE) in the range of about 18 ppm/° C to about 26 ppm/° C. and preferably has a CTE of about 22 ppm/° C. A high elastic modulus is also desirable for restraining the semiconductor die 124 during thermal cycling when the package 120 is in use. A particularly suitable intermetallic compound is copper aluminide (CuAl$_3$), which has a CTE of about 22 ppm/° C. and an elastic modulus higher than that of the semiconductor die 124.

Solder balls 128, commonly referred to as solder bumps, are placed on the contact pads on the second side of the substrate 122 and reflowed using known pick and place and reflow techniques. The solder balls 128 are a eutectic solder having a lower reflow temperature than the solder balls 126 between the semiconductor die 124 and the substrate 122. This permits reflow of the solder balls 128 without significant reflow or movement of the solder balls 126 between the semiconductor die 124 and the substrate 122. Clearly the solder balls 128 are electrically connected to the pads of the semiconductor die 124 via the solder balls 126, and the conductive traces and the contact pads of the substrate 122.

Figure 3:
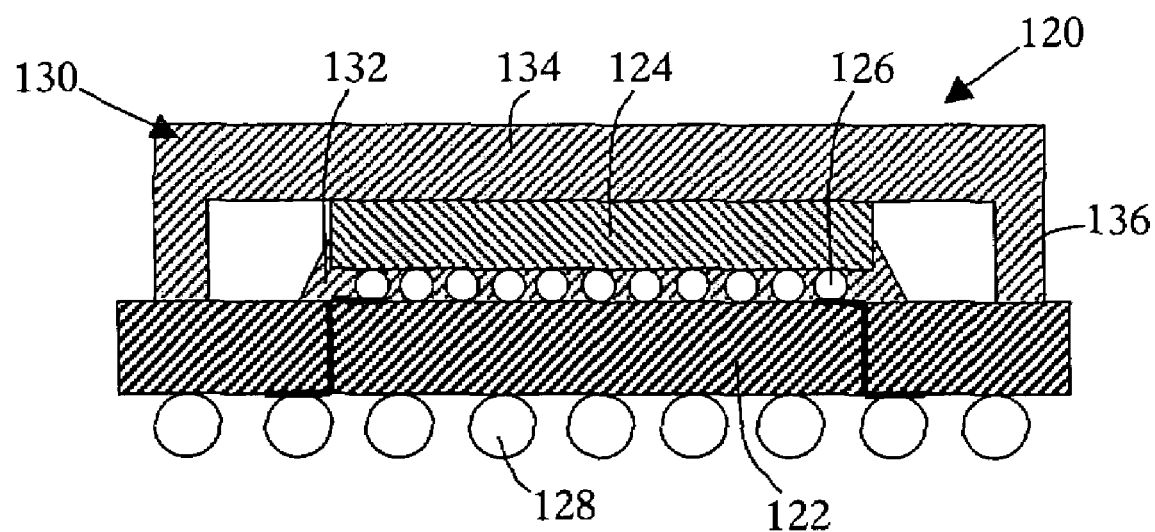
FIG. 3 is a sectional view of a flip-chip ball grid array package according to a second embodiment of the present invention.

Reference is now made to FIG. 3 to describe a second embodiment of the flip-chip BGA package of the present invention. In this embodiment, the intermetallic heat spreader 130 includes a first flat portion 134 that is fixed to the backside of the semiconductor die 124 and four sidewalls 136 that extend downwardly from the first flat portion, to the substrate 122. Only two of the four sidewalls 136 are shown in the sectional view of FIG. 3. The sidewalls 136 are fixed to the substrate using a thermally conductive adhesive or epoxy, thereby providing additional support and stiffness for the BGA package 120. The remainder of the elements of the present embodiment are similar to those of the first-described embodiment and need not be further described herein.

Figure 4:
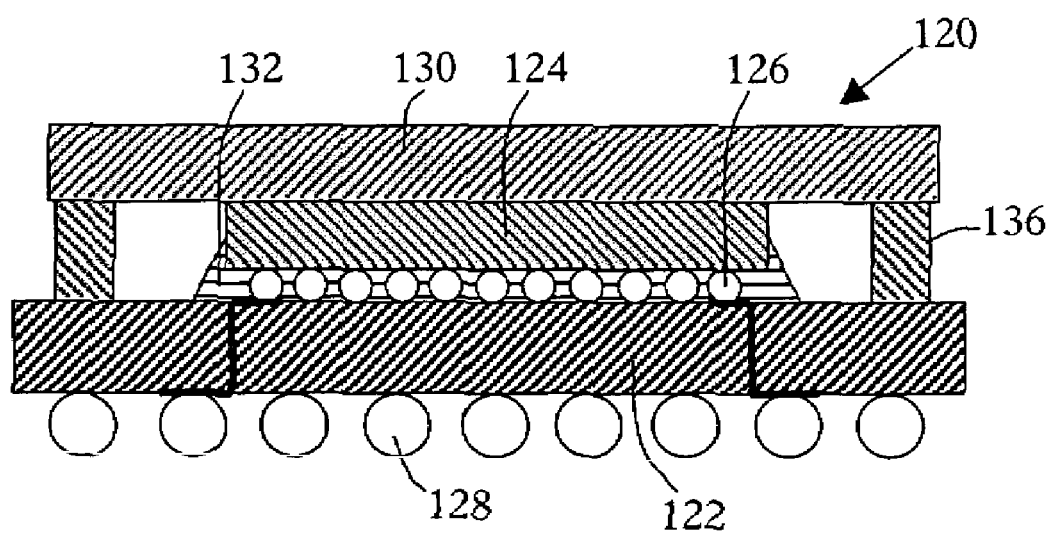
FIG. 4 is a sectional view of a flip-chip ball grid array package according to a third embodiment of the present invention.

Reference is now made to FIG. 4 to describe a third embodiment of the flip-chip BGA package of the present invention. In this embodiment, the intermetallic heat spreader 130 is a flat plate that is fixed to the backside of the semiconductor die 124. Four sidewalls 136 are fixed between the intermetallic heat spreader 130 and the substrate 122, at the periphery of the intermetallic heat spreader 130. The sidewalls 136 are fixed to the heat spreader 130 prior to fixing the heat spreader 130 to the semiconductor die 124 and are fixed to the substrate when the heat spreader 130 is fixed to the semiconductor die 124. The sidewalls 136 are fixed to the heat spreader 130 using a thermally conductive epoxy or adhesive, and similarly, the opposing end of the sidewalls 136 are fixed to the substrate using a thermally conductive epoxy or adhesive. The sidewalls 136 can be made of any suitable material including, intermetallic compound, ceramic or metal such as copper, nickel or iron based metals. The sidewalls 136 provide additional support and stiffness for the BGA package 120. The remainder of the elements of the present embodiment are similar to those of the first-described embodiment and need not be further described herein.

The present invention has been described by way of example. Modifications and variations to the embodiments described herein may occur to those skilled in the art. For example, the intermetallic heat spreader is not limited to CuAl$_3$ and other suitable intermetallic compounds can be used, including NiAl. Still other suitable intermetallic compounds can be used. A list of several intermetallic compounds is included in the attached Appendix A and any suitable intermetallic compound having the desired material properties can be chosen from this list. Still other suitable intermetallic compounds may be possible. Also, the second and third-described embodiments are described as having four sidewalls, however, other numbers of sidewalls are possible. For example, two sidewalls can be used. Still other modifications and variation are possible, all of which are within the sphere and scope of the present invention.

What is claimed is:

1. An integrated circuit package comprising:
   a substrate having first and second surfaces and a plurality of conductive traces therebetween;
   a semiconductor die flip-chip mounted to said first surface of said substrate and electrically connected to ones of said conductive traces;
   an intermetallic heat spreader fixed to a back side of said semiconductor die; and
   a plurality of contact balls disposed on said second surface of said substrate, in the form of a ball grid array, ones of said contact balls of said ball grid array being electrically connected with ones of said conductive traces;
   wherein an intermetallic compound of said intermetallic heat spreader has a modulus of elasticity of at least the modulus of elasticity of the semiconductor die.

2. The integrated circuit package according to claim 1, wherein said semiconductor die is flip-chip mounted to said first surface of said substrate and electrically connected to ones of said conductive traces via a plurality of solder ball connectors.

3. The integrated circuit package according to claim 2, further comprising an underfill material surrounding said solder ball connectors.

4. The integrated circuit package according to claim 1, wherein said solder ball connectors are comprised of eutectic solder.

5. The integrated circuit package according to claim 1, wherein said intermetallic heat spreader is fixed to said back side of said semiconductor die by a thermally conductive adhesive.

6. The integrated circuit package according to claim 1, wherein said intermetallic heat spreader is fixed to said back side of said semiconductor die by a thermally conductive epoxy.

7. The integrated circuit package according to claim 1, wherein said intermetallic heat spreader comprises a first portion fixed to said back side of said semiconductor die and a plurality of sidewalls in contact with said substrate.

8. The integrated circuit package according to claim 7, wherein said sidewalls are fixed to said substrate.

9. The integrated circuit package according to claim 1, wherein said heat spreader is fixed to a plurality of intermediate sidewalls at a plurality of sites, each of said intermediate sidewalls being fixed to said substrate.

10. The integrated circuit package according to claim 9, wherein said intermediate sidewalls comprise an intermetallic material.

11. The integrated circuit package according to claim 1, wherein said intermetallic compound comprises an intermetallic compound having a coefficient of thermal expansion of from about 18 ppm/° C. to about 26 ppm/° C.

12. The integrated circuit package according to claim 1, wherein said intermetallic compound comprises an intermetallic compound having a coefficient of thermal expansion of about 22 ppm/° C.

13. The integrated circuit package according to claim 1, wherein intermetallic compound comprises $CuAl_3$.

14. The integrated circuit package according to claim 1, wherein said intermetallic compound has a modulus of elasticity of more than the modulus of elasticity of the semiconductor die.

15. The integrated circuit package according to claim 1, wherein said intermetallic compound comprises NiAl.

16. An integrated circuit package comprising:
    a substrate having first and second surfaces and a plurality of conductive traces therebetween;
    a semiconductor die flip-chip mounted to said first surface of said substrate and electrically connected to ones of said conductive traces;
    an intermetallic heat spreader having a coefficient of thermal expansion in the range of about 18 ppm/° C. to about 26 ppm/° C., fixed to a back side of said semiconductor die; and
    a plurality of contact balls disposed on said second surface of said substrate, in the form of a ball grid array, ones of said contact balls of said ball grid array being electrically connected with ones of said conductive traces;
    wherein an intermetallic compound of said intermetallic heat spreader has a modulus of elasticity equal to or greater than a modulus of elasticity of the semiconductor die.

17. The integrated circuit package according to claim 16, wherein the heat spreader has a coefficient of thermal expansion of about 22 ppm/° C.

* * * * *

UNITED STATES PATENT AND TRADEMARK OFFICE
CERTIFICATE OF CORRECTION

PATENT NO. : 7,224,048 B1  Page 1 of 1
APPLICATION NO. : 10/678419
DATED : May 29, 2007
INVENTOR(S) : Neil McLellan et al.

It is certified that error appears in the above-identified patent and that said Letters Patent is hereby corrected as shown below:

In the Specification:

In the Specification, column 2, line 15, delete "bails" and replace with --balls--.

Signed and Sealed this

Twentieth Day of November, 2007

JON W. DUDAS
*Director of the United States Patent and Trademark Office*